US009142857B2

(12) United States Patent
Lee et al.

(10) Patent No.: US 9,142,857 B2
(45) Date of Patent: Sep. 22, 2015

(54) APPARATUS FOR HARVESTING AND STORING PIEZOELECTRIC ENERGY AND MANUFACTURING METHOD THEREOF

(75) Inventors: Sang Kyun Lee, Gwangju (KR); Yil Suk Yang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 413 days.

(21) Appl. No.: 13/595,070

(22) Filed: Aug. 27, 2012

(65) Prior Publication Data

US 2013/0049539 A1 Feb. 28, 2013

(30) Foreign Application Priority Data

Aug. 30, 2011 (KR) ................. 10-2011-0086839

(51) Int. Cl.
 *H02N 2/18* (2006.01)
 *H01M 10/052* (2010.01)
 *H01L 41/113* (2006.01)
 *H01M 6/40* (2006.01)
 *H01M 10/0585* (2010.01)

(52) U.S. Cl.
 CPC ......... *H01M 10/052* (2013.01); *H01L 41/1136* (2013.01); *H02N 2/18* (2013.01); *H02N 2/181* (2013.01); *H02N 2/188* (2013.01); *H01M 6/40* (2013.01); *H01M 10/0585* (2013.01); *Y02E 60/122* (2013.01); *Y10T 29/42* (2015.01)

(58) Field of Classification Search
 CPC ....... H02N 2/18; F23Q 3/002; H01L 41/1136
 USPC .................................. 310/339, 330
 See application file for complete search history.

(56) References Cited

U.S. PATENT DOCUMENTS

| | | | |
|---|---|---|---|
| 2003/0224551 A1* | 12/2003 | Kim et al. ............... | 438/49 |
| 2004/0085002 A1 | 5/2004 | Pearce | |
| 2007/0284969 A1* | 12/2007 | Xu .......................... | 310/339 |
| 2008/0001577 A1 | 1/2008 | Sather | |
| 2008/0079333 A1* | 4/2008 | Ulm et al. ................ | 310/339 |
| 2009/0026892 A1* | 1/2009 | Nakamura et al. ...... | 310/367 |
| 2009/0261689 A1* | 10/2009 | Fang ........................ | 310/319 |

OTHER PUBLICATIONS

S.C. Lin et al., "Multi-cantilever piezoelectric MEMS generator in energy harvesting", IEEE International Ultrasonics Symposium Proceedings, Sep. 20-23, 2009, pp. 755-758.

* cited by examiner

*Primary Examiner* — Derek Rosenau
*Assistant Examiner* — Bryan Gordon
(74) *Attorney, Agent, or Firm* — Rabin & Berdo, P.C.

(57) ABSTRACT

Disclosed are an apparatus for harvesting/storing piezoelectric energy, including: a substrate having a groove at a side thereon; a piezoelectric MEMS cantilever having an end fixed to the substrate and the other end floating above the groove, and configured to convert and store an external vibration into electric energy; and a mass formed at one end of the piezoelectric MEMS cantilever and configured to apply a vibration, and a manufacturing method thereof.

8 Claims, 4 Drawing Sheets

APPARATUS FOR HARVESTING AND STORING PIEZOELECTRIC ENERGY AND MANUFACTURING METHOD THEREOF

CROSS-REFERENCE TO RELATED APPLICATIONS

This application is based on and claims priority from Korean Patent Application No. 10-2011-0086839, filed on Aug. 30, 2011, with the Korean Intellectual Property Office, the disclosure of which is incorporated herein in its entirety by reference.

TECHNICAL FIELD

The present disclosure relates to an apparatus for harvesting and storing piezoelectric energy, and more particularly, to an apparatus for harvesting and storing piezoelectric energy that can improve output by setting the resonance frequency of a piezoelectric energy harvesting device to the frequency of ambient vibrations, and store power in a storage device, and a manufacturing method thereof.

BACKGROUND

A piezoelectric energy harvesting device (hereafter, referred to as a 'PEH' device) generates the largest electric energy at the resonance frequency due to amplification of displacement occurring when the resonance frequency of the PEH device and the frequency of ambient vibrations meet each other.

The voltage generated from the PEH device is outputted in an AC (Alternating Current) type. A rectifier is used to convert the AC voltage into DC voltage. The rectifier is composed of four or two diodes, in a full-bridge type or a half-bridge type. A filtering capacitor reducing ripple of the DC voltage is connected to the rear end of the rectifier.

The output DC voltage of the filtering capacitor is used to drive an IC such as a memory, and MCU and RF transmitting/receiving devices. However, the electric energy obtained from small vibrations in an ambient environment is very small in magnitude, so the electric energy is not enough to drive an IC. Accordingly, methods of using stored power, if needed, by charging a storage device, such as a super capacitor, a secondary battery and a thin film battery, have been studied.

The electronic devices used at present in wireless sensor nodes more automatically operate by actively performing the functions or passively sensing or collecting information. For this configuration, a micro-energy supply device that can continuously supply power is required. Although batteries can perform this function, the amount of available energy decreases as time passes due to a limit in the storage capacity, and consequently, it becomes impossible to supply power to a wireless sensor node.

SUMMARY

The present disclosure has been made in an effort to provide a micro-apparatus for harvesting and storing piezoelectric energy that can reduce an electrical loss by setting the resonance frequency of a piezoelectric energy harvesting device to the frequency of ambient vibrations, and can store power in a storage device such as a super capacitor, a secondary battery, and a thin film battery, and a manufacturing method thereof.

The present disclosure also has been made in an effort to provide an apparatus for harvesting/storing piezoelectric energy of which the manufacturing cost can be reduced by simplifying the manufacturing process, and a manufacturing method thereof.

An exemplary embodiment of the present disclosure provides an apparatus for harvesting/storing piezoelectric energy, including: a substrate having a groove at a side thereon; a piezoelectric MEMS cantilever having an end fixed to the substrate and the other end floating above the groove, and configured to convert and store an external vibration into electric energy; and a mass formed at one end of the piezoelectric MEMS cantilever and configured to apply a vibration.

Another exemplary embodiment of the present disclosure provides a method of manufacturing an apparatus for harvesting/storing piezoelectric energy, including: forming a groove at a side on a substrate; embedding and planarizing a polymer in the groove; forming a piezoelectric energy harvesting device, which converts and stores an external vibration into electric energy, onto the substrate; and forming a piezoelectric MEMS cantilever by forming a hole at a side of the piezoelectric energy harvesting device and by removing the polymer in the groove through the hole.

As described above, according to the present disclosure, it is possible to use an apparatus for harvesting/storing piezoelectric energy that converts and stores peripheral vibrations into electric energy as power sources of the devices constituting a wireless sensor network that is self-chargeable and has integrity.

According to the present disclosure, it is possible to implement a micro-self-chargeable power module and an implant type of capsule by providing an apparatus for harvesting/storing piezoelectric energy in an array type.

According to the present disclosure, it is possible to achieve mass production because the manufacturing process is simple, and to integrate the apparatus in a sensor using a MEMS process, by providing an apparatus for harvesting/storing piezoelectric energy in an array type and a manufacturing method thereof.

According to the present disclosure, it is possible to increase performance of collecting energy because the gaps between devices are very small, by providing an apparatus for harvesting/storing piezoelectric energy in an array type and a manufacturing method thereof.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, an exemplary embodiment of the present disclosure will be described in detail with reference to the accompanying drawings. In describing the present disclosure, well-known functions or constructions will not be described in detail since they may unnecessarily obscure the understanding of the present disclosure.

In general, a piezoelectric energy harvesting device (hereafter, referred to as a 'PEH' device) falls into a piezoelectric monomorph PEH device composed of a single piezoelectric layer generating electric output by using pressure or vibration and a non-piezoelectric layer (for example, Si and Al) reinforcing the brittleness of the piezoelectric layer and a piezoelectric bimorph PEH device with piezoelectric layer stacked at both sides of a non-piezoelectric layer. There is a multilayer PEH device implemented by stacking a plurality of piezoelectric layers, instead of stacking two piezoelectric layers.

An apparatus for harvesting/storing piezoelectric energy and a method of manufacturing the apparatus are described by exemplifying a piezoelectric monomorph PEH device.

Figure 1:
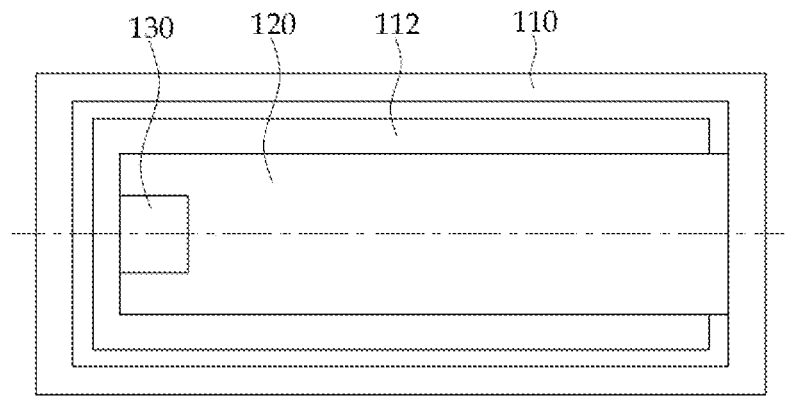
FIGS. 1 and 2 are a plan view and a cross-sectional view, respectively, of an apparatus for harvesting/storing piezoelectric energy according to an exemplary embodiment of the present disclosure.
Figure 2:
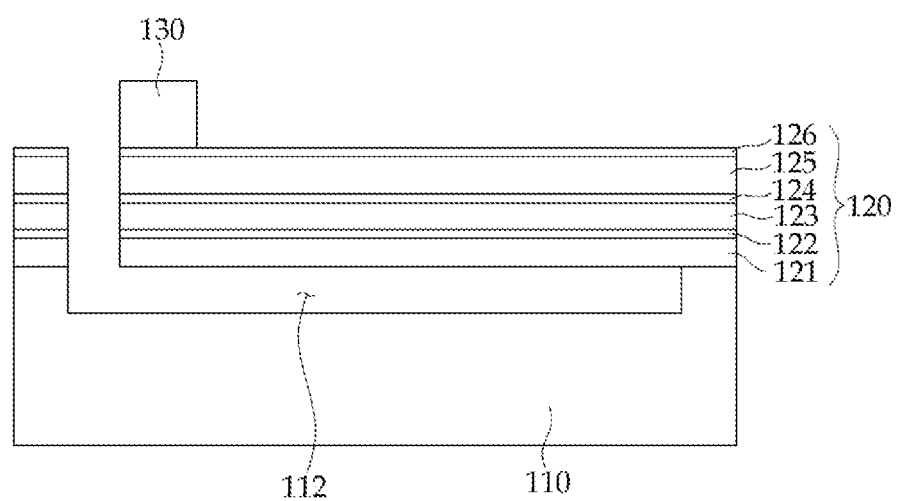

FIGS. 1 and 2 are a plan view and a cross-sectional view, respectively, of an apparatus for harvesting/storing piezoelectric energy according to an exemplary embodiment of the present disclosure.

Referring to FIGS. 1 and 2, an apparatus for harvesting/storing piezoelectric energy according to an exemplary embodiment of the present disclosure includes a substrate 110, a piezoelectric MEMS (Micro Electro Mechanical Systems) cantilever 120, and a tip mass 130.

The substrate 110 has a groove 112 at a side thereon and may be a SOI (Silicon-on Insulator) wafer. The SOI wafer is implemented by inserting an Si layer having a thickness of 20 μm and an $SiO_2$ layer having a thickness of 1 μm between Si. $SiO_2$ or $Si_3N_4$ may be deposited on the substrate 110 according to an exemplary embodiment of the present disclosure to prevent diffusion of a piezoelectric material to the substrate 110 in deposition of a piezoelectric layer 125 and an electric short and remove residual stress of a multilayer structure.

The piezoelectric MEMS cantilever 120 has one end fixed to the substrate and the other end floating above the groove 112, and converts and stores an external vibration into electric energy. For this configuration, the piezoelectric MEMS cantilever 120 includes a capacitor 121, a first electrode 122, a thin film battery 123, a second electrode 124, a piezoelectric layer 125, and a third electrode 126.

The capacitor 121 reduces ripple of the voltage outputted from a rectifier (not illustrated). The capacitor 121, as illustrated in FIG. 2, may be manufactured in advance in the apparatus for harvesting/storing piezoelectric energy or may be connected in a chip capacitor type at the outside.

The first electrode 122 has high electric conductivity and thermal stability at a high temperature and contains Pt/Ti to increase an adhesive property for a lower layer.

The thin film battery 123, a storage device storing electric energy, is formed on the first electrode 122 and stores the electric energy converted by the piezoelectric layer 125. For this configuration, the thin film battery 123 may be composed of two current collectors, two electrodes, and an solid electrolyte therebetween, which is described in detail with reference to FIG. 3.

A second electrode 124 is formed on the thin film battery 123. The second electrode 124 has high electric conductivity and thermal stability at a high temperature and contains Pt/Ti to increase an adhesive property to a lower layer.

A piezoelectric layer 125 is formed on the second electrode 124 and converts an external vibration into electric energy. The piezoelectric layer 125 may contain PZT, PMN-PT, PZN-PT, PMN-PZT, MFC (Micro-fiber Composite), ZnO, and AlN and may be achieved by multi-coating until a desired thickness is obtained.

A third electrode 126 is formed on the piezoelectric layer 125, has high electric conductivity, and contains Pt to have thermal stability at a high temperature.

The tip mass is positioned at one end of the third electrode 126 and applies a vibration to the piezoelectric MEMS cantilever 120.

As described above, it is possible to provide a microapparatus for harvesting/storing piezoelectric energy by providing an apparatus for harvesting/storing piezoelectric energy in which a PEH device and a storage device are integrated on the same substrate, in an exemplary embodiment of the present disclosure.

Figure 3:
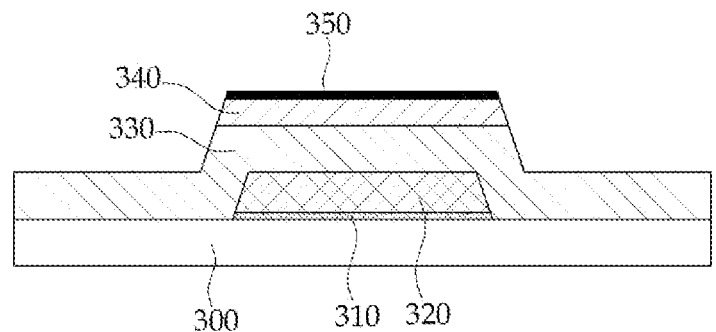
FIG. 3 is a cross-sectional view of a thin film battery according to an exemplary embodiment of the present disclosure.

FIG. 3 is a cross-sectional view of a thin film battery according to an exemplary embodiment of the present disclosure.

Referring to FIG. 3, the thin film battery 123 according to an exemplary embodiment of the present disclosure includes a substrate 300, a first current collecting layer 310, a first electrode 320, an electrolyte layer 330, a second electrode 340, and a second current collecting layer 350.

The substrate 300 may be made of Si, glass, ceramic, metal, plastic, and a polymer.

The first current collecting layer 310 is formed on the substrate 300 and contains Pt/Cr.

The first electrode 320 is formed on the first current collecting layer 310 and contains $LiCoO_2$. The first electrode 320 may be a cathode electrode or an anode electrode.

The electrolyte layer 330 is formed on the substrate 300 including the first electrode 320 and may be made of a lithium mixture.

The second electrode 340 is formed on the electrolyte layer 330 and contains SnO. The second electrode 340 may be an anode electrode or a cathode electrode with a polarity opposite to that of the first electrode 320.

The second current collecting layer 350 is formed on the second electrode 340 and contains Pt.

The thin film battery 123 according to an exemplary embodiment of the present disclosure may further include a protective layer (not illustrated) covering the entire thin film battery 123 to prevent diffusion of the lithium in the electrolyte layer 330.

FIGS. 4A to 4D are process flowchart illustrating a method of manufacturing an apparatus for harvesting/storing piezoelectric energy according to an exemplary embodiment of the present disclosure.

Figure 4A:
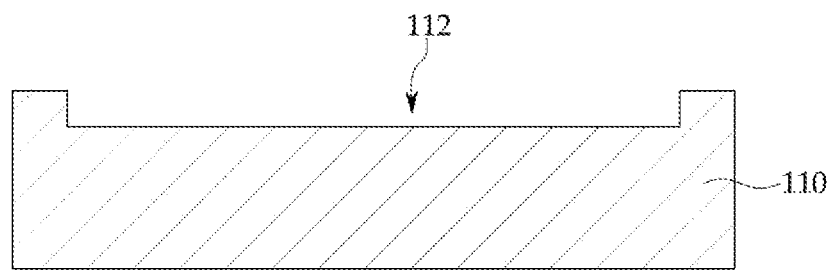
FIGS. 4A to 4D are process flowchart illustrating a method of manufacturing an apparatus for harvesting/storing piezoelectric energy according to an exemplary embodiment of the present disclosure.

Referring to FIG. 4A, the groove 112 is formed at a side on the substrate 110, which may be a Si substrate or a SOI substrate. In detail, the groove 112 is formed by forming a rectangular photoresist pattern at the position where the piezoelectric MEMS cantilever 120 is formed, and then performing RIE (Reactive Ion Etching).

Figure 4B:
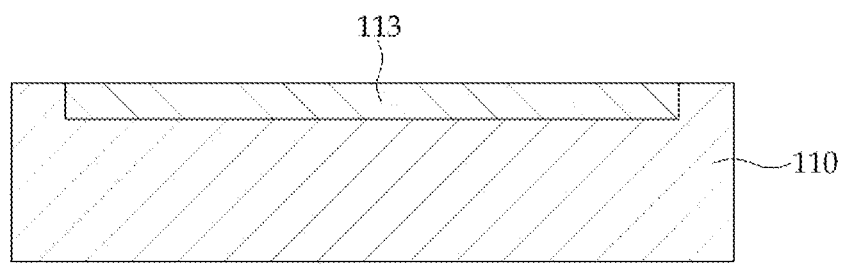

Referring to FIG. 4B, the groove 112 is filled with a polymer 113 such as PMMA or SU8 and then the polymer 113 is planarized by CMP (Chemical Mechanical Polishing). The polymer 113 prevents side etching by being provided with higher selection ratio than silicon in isotropic dry etching using $SF_6$ or $XeF_2$, which is described below.

Figure 4C:
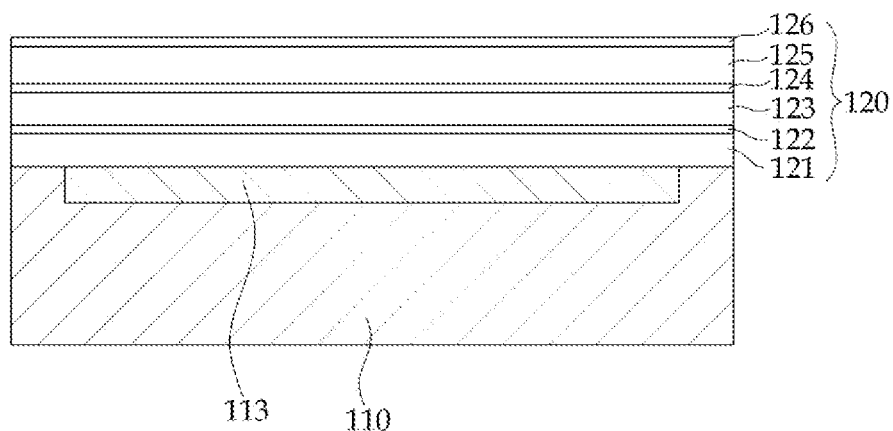

Referring to FIG. 4C, a PEH device is formed by sequentially stacking the capacitor 121, the first electrode 122, the thin film battery 123, the second electrode 124, the piezoelectric layer 125, and the third electrode 126, on the substrate 110. The first electrode 122 and the second electrode 124 are formed by sputtering with Pt/Ti. The piezoelectric layer 125 is formed by multi-coating with a piezoelectric material such as PZT, PMN-PT, PZN-PT, PMN-PZT, MFC (Micro-fiber Composite), ZnO, and AlN and until a desired thickness is obtained. The third electrode 126 is formed by sputtering with Pt.

Meanwhile, a method of manufacturing the thin film battery 123 according to an exemplary embodiment of the present disclosure is described below with reference to FIG. 3.

The first current collecting layer 310 is formed by depositing Pt/Cr onto the substrate 300 and the first electrode 320 is formed by depositing $LiCoO_2$ onto the first current correcting layer 310.

Subsequently, the electrolyte layer 330 is formed by depositing a lithium mixture onto the substrate 300 including the first electrode 320.

Finally, the second electrode 340 is formed by depositing SnO onto the electrolyte layer 330 and the second current collecting layer 350 is formed by depositing Pt onto the second electrode 340.

A protective layer (not illustrated) covering the entire thin film battery 123 may be further formed to prevent diffusion of the lithium in the electrolyte layer 330.

Figure 4D:
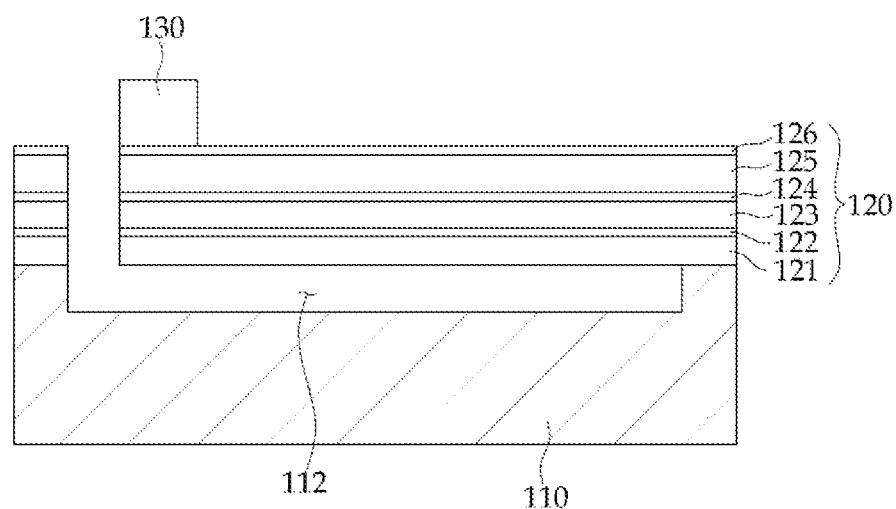

Referring to FIG. 4D, a hole 120a is formed at a side of the PEH device by isotropic dry etching using $XeF_2$ or $SF_6$ and the piezoelectric MEMS cantilever 120 is formed by removing the polymer 113 in the groove 112 through the hole 120a. The mass 127 is formed in this process, using a photoresist pattern.

Figure 5:
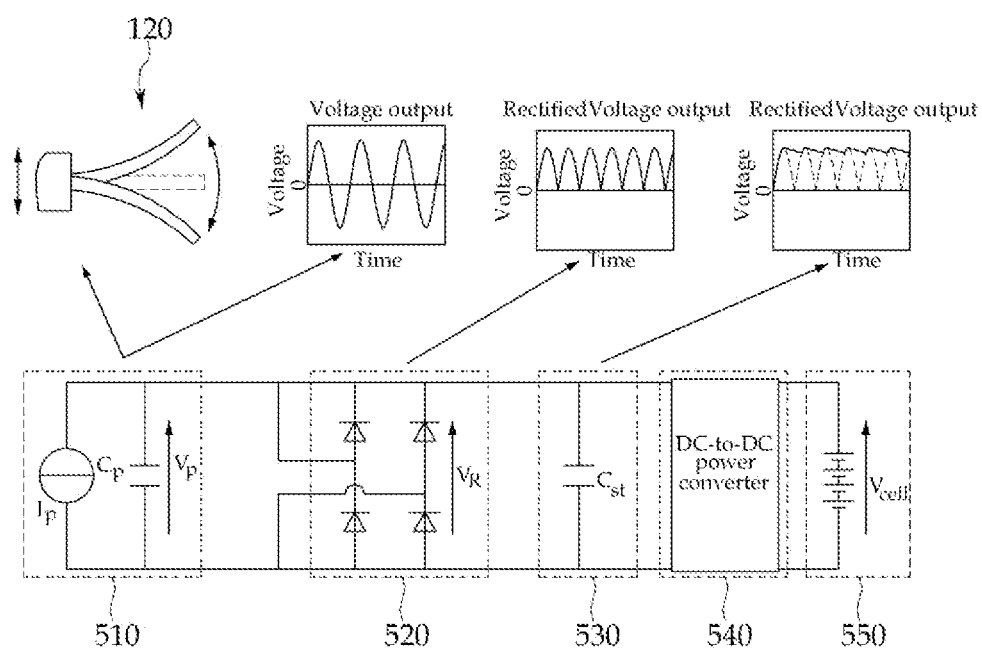
FIG. 5 is a circuit diagram of an apparatus for harvesting/storing piezoelectric energy according to an exemplary embodiment of the present disclosure.

FIG. 5 is a circuit diagram of an apparatus for harvesting/storing piezoelectric energy according to an exemplary embodiment of the present disclosure.

As illustrated in FIG. 5, the apparatus for harvesting/storing piezoelectric energy according to an exemplary embodiment of the present disclosure includes a PEH device 510, a rectifier 520, a capacitor 530, a DC-DC power converter 540, and a storage device 550.

The PEH device 510 converts an external vibration into electric energy and outputs an AC voltage.

The rectifier 520 converts the AC voltage generated from the PEH device 510 into a DC voltage. The rectifier 520 may be manufactured in advance in the apparatus for harvesting/storing piezoelectric energy or may be connected in an IC type at the outside.

The capacitor 530 reduces ripple of the DC voltage outputted from the rectifier 520. The capacitor 530, as illustrated in FIG. 2, may be manufactured in advance in the apparatus for harvesting/storing piezoelectric energy or may be connected in an IC type at the outside.

The DC-DC power converter 540 converts the DC voltage outputted from the capacitor 530 to a voltage suitable to be stored in the storage device 550. The DC-DC power converter 540 may also be manufactured in advance in the apparatus for harvesting/storing piezoelectric energy or may be connected in an IC type at the outside.

The storage device 550 stores the voltage outputted from the DC-DC power converter 540. Although the exemplary embodiment of the present disclosure exemplifies a thin film battery as the storage device 550, the storage device 550 may be a super capacitor and a secondary battery.

Further, although the exemplary embodiment of the present disclosure exemplifies a single PEH device and a single thin film battery for the convenience of description, the present disclosure is not limited thereto, and a plurality of PEH devices may be arranged in an array type or a plurality of thin film batteries may be connected with a PEH device in parallel or in series in order to increase the output voltage of the apparatus for harvesting/storing piezoelectric energy.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An apparatus for harvesting/storing piezoelectric energy, comprising:
    a substrate having a groove at a side thereon; and
    a piezoelectric MEMS cantilever having an end fixed to the substrate and the other end floating above the groove, and configured to convert and store an external vibration into electric energy,
    wherein the piezoelectric MEMS cantilever includes:
    a capacitor configured to remove ripple of voltage;
    a first electrode formed on the capacitor;
    a thin film battery formed on the first electrode;
    a second electrode formed on the thin film battery;
    a piezoelectric layer formed on the second electrode; and
    a third electrode formed on the piezoelectric layer.

2. The apparatus of claim 1,
    further comprising:
    a mass formed at one end of the piezoelectric MEMS cantilever and configured to apply a vibration.

3. The apparatus of claim 1, wherein the thin film battery includes:
    a first current collecting layer;
    a first electrode formed on the first current collecting layer;
    an electrolyte layer formed on the first electrode;
    a second electrode formed on the electrolyte layer; and
    a second current collecting layer formed on the second electrode.

4. The apparatus of claim 3, wherein the thin film battery further includes a protective layer covering the entire thin film battery.

5. The apparatus of claim 1, wherein the piezoelectric layer contains at least one of PZT, PMN-PT, PZN-PT, PMN-PZT, MFC (Micro-fiber Composite), ZnO, and AN.

6. The apparatus of claim 1, wherein the first electrode and the second electrode contain Pt/Ti.

7. The apparatus of claim 1, wherein the substrate is an SOI (Silicon-on Insulator) wafer.

8. The apparatus of claim 1, wherein $SiO_2$ or $Si_3N_4$ is deposited on the substrate.

* * * * *